United States Patent [19]
Horne

[11] Patent Number: 5,882,434
[45] Date of Patent: Mar. 16, 1999

[54] SOLAR CONCENTRATOR HAVING AN OFFSET PARABOLIC CONFIGURATION

[75] Inventor: William E. Horne, Renton, Wash.

[73] Assignee: United Solar Technologies, Inc., Olympia, Wash.

[21] Appl. No.: 725,645

[22] Filed: Oct. 15, 1996

[51] Int. Cl.$^6$ .............................. H01L 25/00; H02N 6/00; F24J 2/12
[52] U.S. Cl. ......................... 136/246; 126/686; 126/690; 126/694
[58] Field of Search ............................. 136/246; 126/686, 126/690, 694

[56] References Cited

U.S. PATENT DOCUMENTS

| | | | |
|---|---|---|---|
| 4,240,692 | 12/1980 | Winston | 136/246 |
| 5,269,851 | 12/1993 | Horne | 136/248 |

Primary Examiner—Mark Chapman
Attorney, Agent, or Firm—Jensen & Puntigam, P.S.

[57] ABSTRACT

The solar concentrator system includes a generally parabolic-shaped primary reflector having a flat region at the center thereof, so that the focus of the primary reflector is a ring about the center axis of the reflector, in the plane of the rim thereof. A receiver, in the shape of an inverted, truncated cone, is positioned so that the peripheral surface of the receiver is approximately coincident with the ring focus. Solar cells are positioned in lines on the peripheral surface of the receiver. Prefilter tubular secondary concentrator elements are positioned just in front of the lines of solar cells, providing an additional focusing capability and improving the concentration of the solar rays, while being spaced sufficiently that the unilluminated areas between the lines of solar cells can accommodate electrical interconnectors.

12 Claims, 7 Drawing Sheets

FIG. 12

SOLAR CONCENTRATOR HAVING AN OFFSET PARABOLIC CONFIGURATION

TECHNICAL FIELD

This invention relates generally to the field of solar concentrators and more specifically concerns a particular solar concentrator configuration.

BACKGROUND OF THE INVENTION

In the past, solar concentrators have typically been configured to produce either a point focus or a line focus for the impinging solar rays. Line focus concentrators are in the form of an elongated trough, with the line focus basically being in a plane which includes the opposing longitudinal edges of the trough. Point focus concentrators, on the other hand, have been dish-shaped, typically parabolic in cross-section.

At the focal point of the point focus concentrators will typically be either a boiler assembly, in which a selected liquid is heated to high temperatures by the solar rays reflected and focused from the surface of the concentrator or, in some cases, a solar cell assembly, such as shown in U.S. Pat. No. 5,269,851, which is assigned to the assignee of the present invention, the contents of which are hereby incorporated by reference. Typically, such concentrators have a concentration ratio in the range of 500:1, which may be increased somewhat by the use of a prefilter/secondary concentrator positioned in front of the solar cells, which adds an additional focusing capability for the concentrator and has the further benefit of removing some of the heat from the solar cells when liquid is moved therethrough.

While the above-described concentrator structure certainly has some advantages over other solar energy systems in efficiency and cost, it is desirable that efficiency be still further increased, so as to make solar energy competitive with other forms of energy, particularly petroleum. In addition, the primary concentrator portions of solar concentrator systems have usually required "optical quality" finishes for their reflective surfaces to maintain system efficiency. Such optical-quality finishes contribute significantly to the expense of such concentrator systems.

SUMMARY OF THE INVENTION

Accordingly, the present invention includes a solar concentrator system for focusing solar rays incident thereon to a receiver portion, including: a parabolic reflector having a reflective surface which is generally flat from a center axis of the reflector to a line which extends about the center axis, located a selected distance from the center axis and from there is generally parabolic to a rim of the reflector, such that the focus of the reflector is on a ring surface surrounding the center axis; and a receiver having a plurality of solar cells arranged on a peripheral surface thereof, the surface being generally coincident with the ring surface focus of the reflector.

BEST MODE FOR CARRYING OUT THE INVENTION

Figure 1:
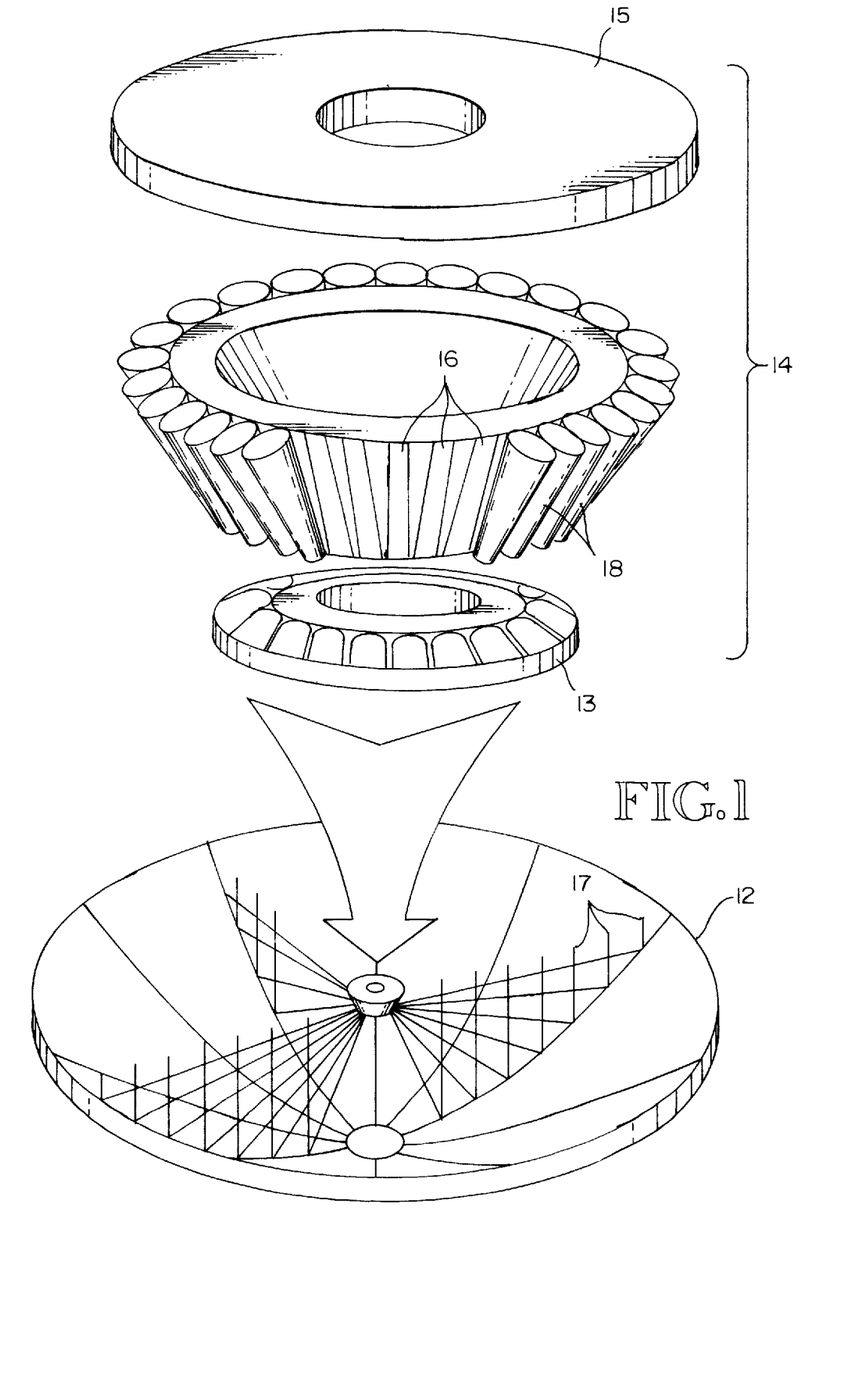
FIG. 1 is a schematic diagram showing the complete concentrator system of the present invention.

FIG. 1 shows a complete solar concentrator system of the present invention, including a primary concentrator 12, a receiver 14 which is positioned generally at the focus of the primary concentrator 12 and includes a base plate 13 and top plate 15, a plurality of solar cells 16—16 mounted on a surface of the receiver 14, and prefilter elements 18—18 which are positioned just in front of each of the solar cells 16—16. Solar rays shown at 17—17 reflect from the primary concentrator 12 onto the prefilter elements 18. Each prefilter 18 functions both as a secondary concentrator and as a cooling element, by use of liquid which is moved through internal channels in the prefilter as well as the receiver. The heated prefilter liquid can then be used as an additional energy source.

The primary concentrator 12 can have a variety of reflective surfaces, including for example glass or other highly reflective surface. The primary concentrator is generally parabolic, but includes a portion thereof which has a particular configuration other than parabolic, which distinguishes it from other concentrator systems. The primary concentrator of the present invention is configured in what is referred to as an offset parabola, i.e. the parabolic curve begins at a selected distance or radius from the center axis of the concentrator. From the center axis to this radius the surface of the concentrator is flat. This is illustrated in FIGS. 2–4.

Figure 2:
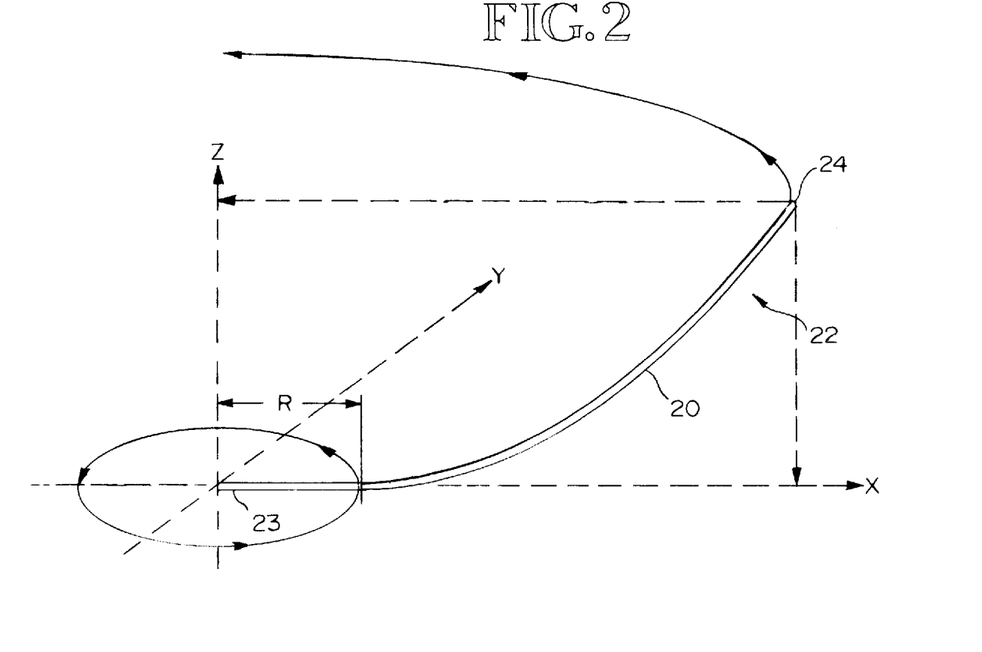
FIG. 2 is a simplified diagram showing the configuration of the concentrator of the present invention.

FIG. 2 shows a cross-sectional outline of a portion 20 of the concentrator 22, with conventional X-Y-Z coordinates. Rotation of portion 20 about the center axis of the concentrator (the Z axis in FIG. 2) will produce the concentrator configuration of the present invention. The concentrator surface thus extends outwardly from the zero point 23 (the center axis point) along the X-axis for a distance R, at which point (actually a circle around the centered axis) the surface of the concentrator curves upwardly in a generally parabolic configuration. In one specific example, where the diameter of the primary concentrator 12 at its rim 24 is 84 inches, distance R will be approximately 3 inches. A range of R for various reflector diameters might be 2–6 inches, for example.

Figure 3:
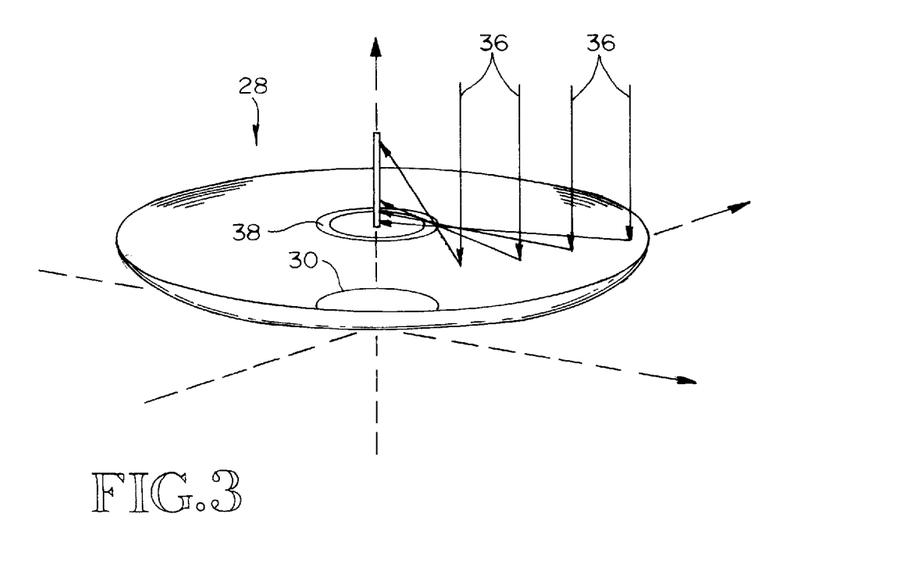
FIG. 3 is a diagram showing in more detail the concentrator configuration of FIG. 2, including the focus of the concentrator.
Figure 4:
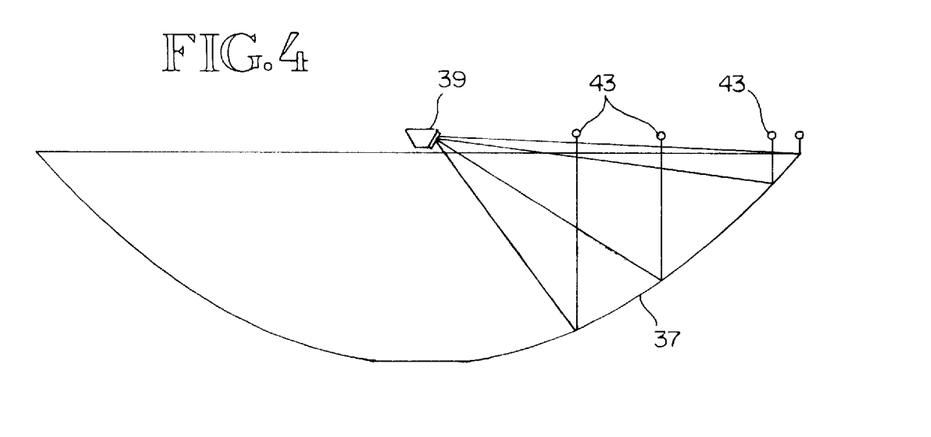
FIG. 4 is a simplified elevational view of the concentrator system of FIG. 2.

A more complete view of the concentrator is shown in FIG. 3 at 28, with the parabolic curvature portion beginning along a circular line 30 which is removed from the central Z-axis 32 by a selected distance.

One result of this particular concentrator configuration is that the focus of the concentrator, instead of being a point, is in the shape of a ring, generally in the plane of the rim of the concentrator, with the radius of the ring being identical to the radius of the flat portion of the concentrator spaced outwardly from the center axis. The height of the ring will vary, depending upon the configuration of the curved portion of the concentrator. FIG. 3 shows a plurality of incident light rays 36—36 and their respective reflective paths to the ring focus 38. It is at the ring focus 38 where the concentration of the reflected rays is at its highest, although the reflected light rays, if uninterrupted at the ring focus, will converge at a vertical line which is the Z-axis of the concentrator, although these rays will be spread out along the Z-axis as the beams disperse away from the ring focus 38, as illustrated in FIG. 3.

Since, for efficiency purposes, it is desirable to place the receiver portion of the concentrator system at the focus of the concentrator, the system of FIG. 1 includes a receiver which is positioned coincident with the ring focus configuration of the primary concentrator. This is shown in simplified elevational form in FIG. 4, which includes an outline of an offset parabolic concentrator 37, a receiver 39 positioned generally in the plane of the rim 41 of concentrator 37, and several representative incident light rays 43—43 showing the path of travel of light rays to the receiver.

Figure 8:
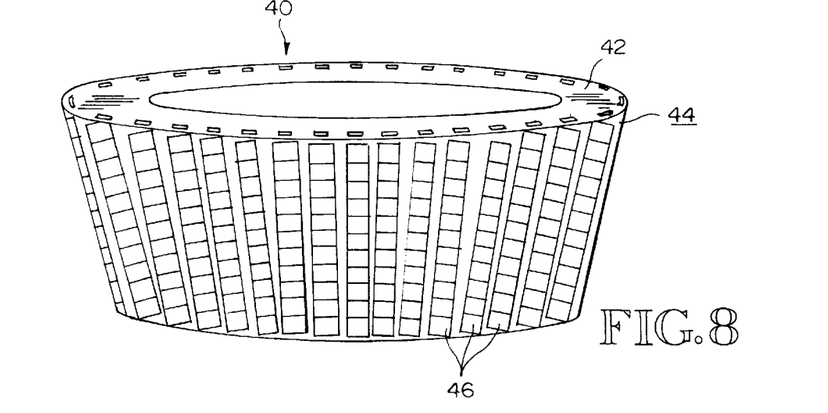
FIG. 8 is an elevational view showing the solar cell mounting arrangement on the receiver of the present invention.

The receiver portion is shown generally in FIG. 8. The general receiver 40 configuration is an inverted, truncated cone having a midpoint (between its upper and lower surfaces) diameter approximately that of the diameter of the ring focus of the concentrator. The receiver will also generally include a top plate and a base plate as shown in FIG. 1. The body portion of receiver 40 includes a substrate 42, which in the embodiment shown is made from copper. Aligned on the exterior surface 44 of substrate 42 are a plurality of strip arrangements 46 of individual solar cells. In the embodiment shown, there are 32 such strip arrangements around the periphery of the substrate 42, with each strip arrangement 46 including a total of 16 individual solar cells in the embodiment shown. The solar cells are typically high efficiency solar cells, such as gallium arsenide (GaAs) cells, but the particular type of solar cell is not critical to the present invention.

The truncated cone configuration is desirable but not necessary, as it results in more incident light rays impinging on the exterior surface of the receiver over a shorter vertical distance than would be the case with a cylindrical receiver. While a cylindrical receiver could be used, the cylinder would either have to be relatively tall in order to receive the same total amount of reflected light as the truncated cone arrangement, or the focal point of the parabolic concentrator would have to be moved inside the rim angle of the concentrator, located at about the midpoint between the rim and the base of the concentrator.

Examples of paths of incident light rays from the primary concentrator to the receiver are shown both in FIG. 4 and in FIG. 5, which also includes a portion of the prefilter arrangement, discussed below. The details of the construction of the receiver and the particular connection of the solar cells on the receiver surface will be explained in more detail in following paragraphs.

Figure 5:
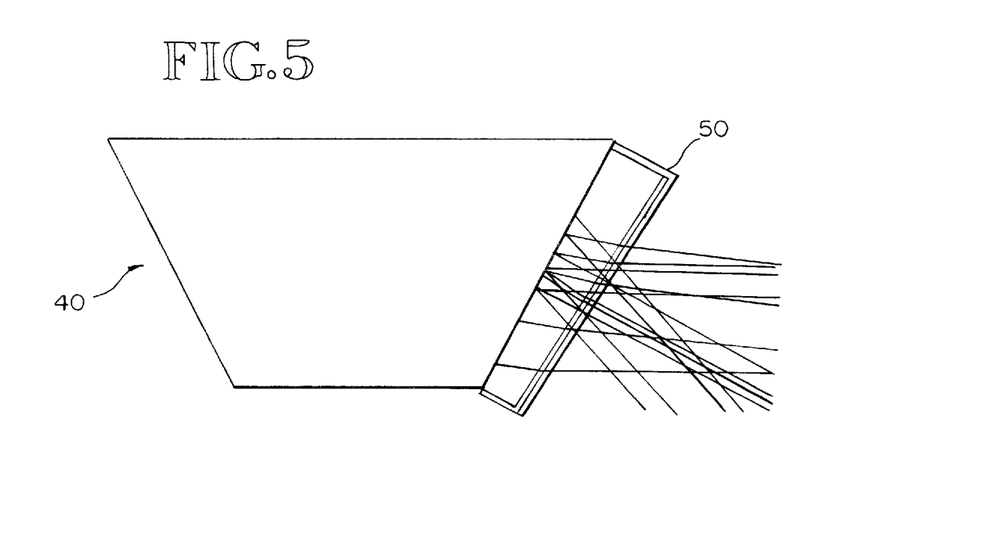
FIG. 5 is an elevational view showing the receiver and one prefilter portion of the concentrator system.
Figure 6:
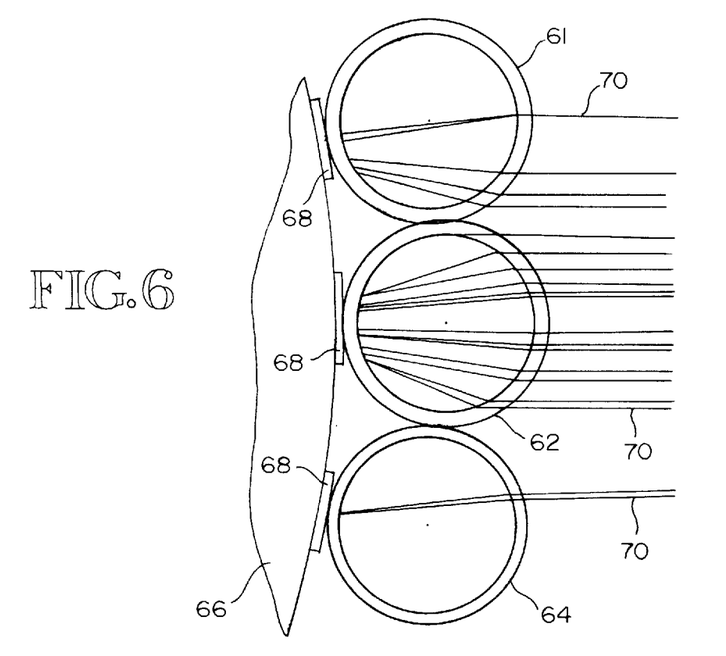
FIG. 6 is a cross-sectional view showing a portion of the receiver/prefilter portion of the concentrator system.
Figure 7:
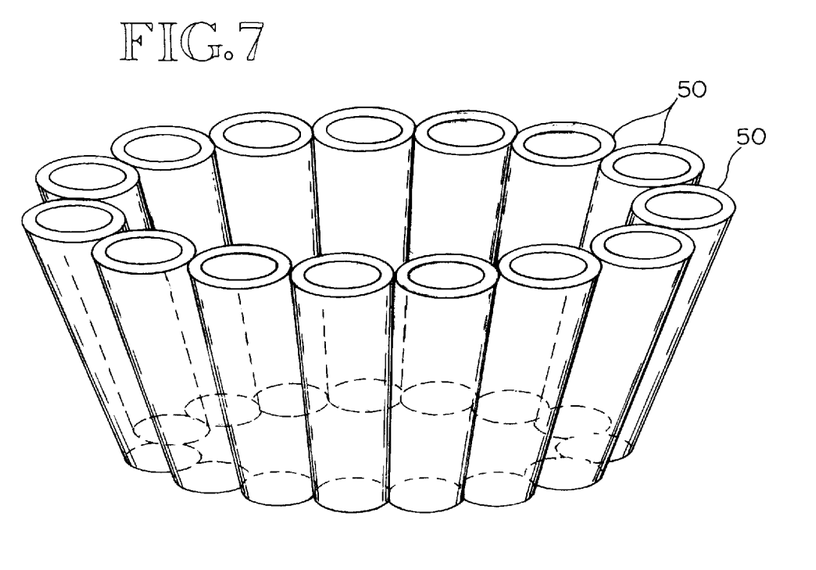
FIG. 7 is an elevational view showing a prefilter portion of a concentrator system of the present invention.

The prefilter arrangement is shown in FIGS. 5–7. As discussed above, in the concentrator arrangement of the present invention, a truncated cone-shaped receiver 40 includes a plurality of individual strips or connected sequences of solar cells arranged around the exterior peripheral surface thereof, as shown most clearly in FIG. 8. The exterior surface area of the truncated cone is sufficient that there are spaces between adjacent strips of solar cells, which provides room for the required electrical connections and additional components, such as safety diodes. Positioned around the peripheral surface of the receiver, substantially immediately in front of the solar cells on the receiver is a prefilter assembly, which comprises a plurality of individual tubular prefilter elements 50—50, as shown generally in FIGS. 5 and 7. There is a separate tubular element associated with each strip of solar cells, with the length of the each tubular element having the same length as the height of the receiver 40.

In the embodiment shown, which includes a total of 32 prefilter tubular elements, one for each solar cell strip, each tubular element has a wall diameter of approximately 0.75 inches and a wall thickness of 0.1 inches, which will provide the required structural strength to withstand the pressure of liquid flowing through the interior of the tubular element. The use of relatively thin wall elements is acceptable, because each tubular element is only carrying a fraction of the total liquid flow around the receiver. The prefilter tubular elements will be positioned immediately in front of the solar cells, substantially as shown in FIG. 6, and will be arranged around the periphery of the receiver, at an angle substantially identical with the angle of the peripheral surface of the receiver, immediately in front of their associated solar cell strips, as shown in FIG. 5. The tubular elements will be arranged as a group as shown in FIG. 7, except that FIG. 7 includes only 15 tubes, for ease and clarity of illustration.

The prefilter has two primary purposes, as taught in the '751 patent. The first purpose is to relieve some of the heat load on the solar cells, as well as absorbing the infrared portion of solar energy otherwise incident on the receiver, which is approximately 40 percent of the energy in the solar spectrum and to which most solar cells are not responsive, so that it produces only additional heat in the solar cells. The heat is carried away in the manner illustrated in FIG. 10, which shows a portion of a receiver substrate 54, opposing solar cell arrays 56 and 58 positioned on the peripheral surface of the substrate, and two adjacent, opposing prefilter tubular elements 59 and 60.

Figure 10:
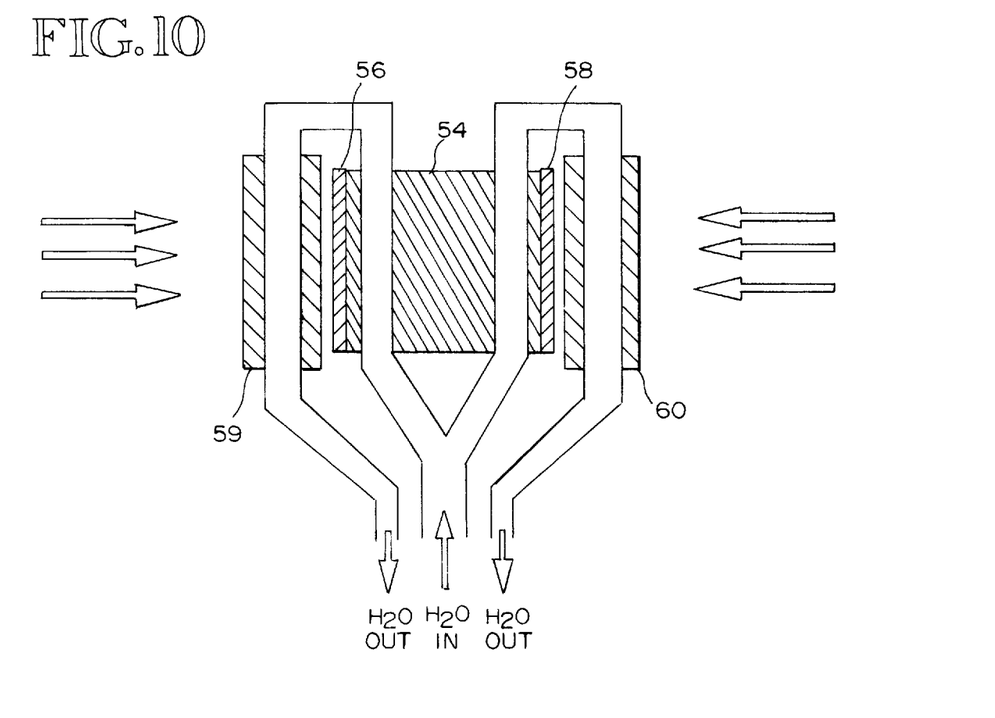
FIG. 10 is a cross-sectional view of the receiver of the present invention, illustrating the coolant flow in the receiver.

Fluid, such as water, is moved into the receiver through separate channels in the substrate 54 (usually one for each solar cell strip), where it picks up heat from the substrate which has in turn been heated by the solar cells. The temperature of the fluid is thus elevated approximately to the temperature of the solar cells. The fluid then moves through each prefilter element, where it directly absorbs the infrared portion of the solar energy spectrum from the rays from the primary concentrator. The energy absorbed by the fluid as it passes through the prefilter is approximately the same as the energy absorbed from solar cell heat in the receiver substrate. Thus, the exit temperature of the cooling fluid from the prefilter is approximately twice the operating temperature of the solar cells. The temperature of the fluid is usually high enough to qualify the exiting fluid as an alternative energy source.

The second primary purpose of the prefilter is to provide a second concentration of the reflected rays. This is illustrated most clearly in FIG. 6, but is also shown in FIG. 5. The cylindrical shape of the tubular elements produces a further focusing of the incident light rays onto their associated solar cell strips. In FIG. 6, three adjacent tubular elements 61, 62 and 64 are shown, relative to a receiver shown partially at 66 and solar cell strips 68—68. The tubular elements, i.e. element 62, further focuses incident light rays 70—70 onto the solar cells. This additional concentration factor can be as high as 3:1 for the configuration shown (higher for larger diameter tubular elements and/or higher index fluids), which will thus raise, for example, an existing concentration ratio of 500:1 for a primary concentrator to a system concentration ratio of 1500:1. This is advantageous, since it permits the use of a primary concentrator which does not have an optical-quality reflective surface, as part of a high concentration, and hence high efficiency, system. The primary concentrator, since its reflective surface need not be optical quality, can thus be significantly less expensive than otherwise.

One of the advantages of combining a tubular prefilter arrangement with an offset parabola concentrator is that the combination can take advantage of the full concentrating power of the primary concentrator for the parabolically directed rays, i.e. those rays which are reflected off the surface of the primary concentrator. The wide angle concentration of the incident rays is accomplished by the primary concentrator onto a ring about the center axis of the concentrator. The height of the ring is determined by the total error of the reflected beam. The secondary concentration is accomplished portion by portion around the ring focus, and each tubular secondary focusing element need only accommodate a relatively small angular portion of the reflected rays. The total focusing effort thus is accomplished in two steps, by an initial single concentrator in combination with a large plurality of secondary concentrator elements.

The overall height of the secondarily focused rays on the solar cells depends upon several factors, including the angular distribution of the solar rays, errors in the system pointing mechanism (relative to the sun), deviation in the surface of the reflector from a true parabolic shape, and quality (roughness) of the reflector.

As mentioned above, the prefilter secondary focusing arrangement permits the use of low-cost primary reflectors, particularly the use of lower quality reflective surfaces, while still maintaining a relatively high concentration so that the system is efficient and competitive. Effective competition with other energy sources, notably petroleum, remains an extremely important factor in solar energy.

Figure 9:
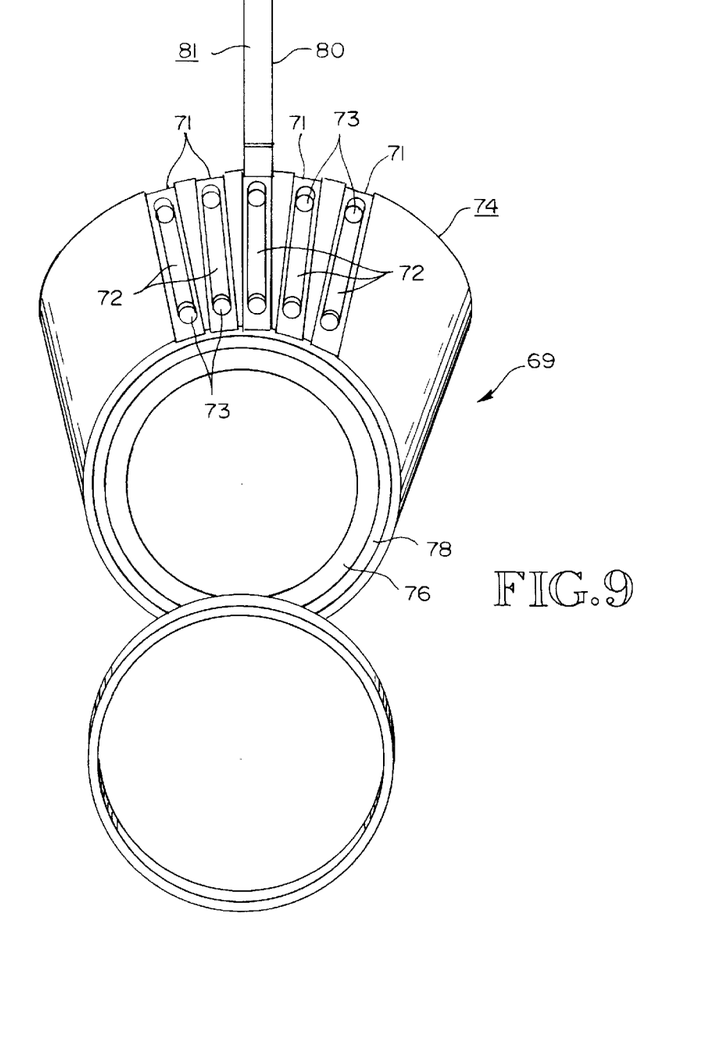
FIG. 9 is a perspective view (partially disassembled) showing the cooling structure of the receiver of the present invention.

The receiver construction and configuration is shown in FIGS. 8 and 9. As indicated above, the receiver in the embodiment shown is generally in the form of a truncated cone. While the receiver could have other configurations, a truncated cone shape has the advantage of providing a stable mounting element for solar cells, while permitting the capture of a greater number of solar rays in the same vertical distance than would be accomplished by a cylindrical receiver.

FIG. 9 shows the details of the receiver substrate construction. In the embodiment shown, the substrate 69 is copper and has a plurality of longitudinal slots 71—71 which are milled into the substrate around the entire periphery thereof, one for each solar cell strip. The slots extend for the complete height of the receiver. In one embodiment, the substrate is 1-inch thick and the slots are milled approximately ⅛-inch deep into the substrate. Individual coolant channels 72—72 are then milled further into the substrate along the bottom of each slot 71. The coolant channels 72—72, however, do not extend all the way to the respective top and bottom surfaces of the receiver. Approximately ⅜ inch of substrate remains at the respective ends of the coolant channels. In the embodiment shown, the coolant channels 72—72 are somewhat narrower than the slots 71 and approximately ¼-inch deeper, which leaves a narrow lip at the dividing point between the slots 71 and the deeper coolant channels 72.

In the respective end (top and bottom) surfaces 74 and 76 of the substrate are annular plenum chambers 78. There is no communication between the plenum chambers 78 and the slots 71—71. However, at the respective ends of each coolant channel 72, a small opening 73, typically made by drilling, extends through the remaining substrate to the plenum chamber at that end. There is hence fluid communication between each of the coolant channels 72 and the plenum chambers at the respective ends of the substrate.

In one embodiment, each end of each coolant channel is in fluid communication with the plenum chamber adjacent thereto, the plenum chamber being continuous, while in another embodiment, the plenum chamber is not continuous but takes the form of successive segments arranged so that one end of each coolant channel is in fluid communication via a plenum segment to the adjacent end of the previous channel and the other end of the channel is in fluid communication via a plenum segment to the adjacent end of the successive channel, thus creating a serpentine path of coolant through the channels and the plenum segments. In both embodiments, the coolant channels and the plenum chambers provide a passageway for movement of cooling fluid through the substrate of the receiver, carrying away heat generated by the solar cells.

Lastly, slot covers 80—80 are configured so as to mate with the slots 71—71 which are milled into the substrate, resting against the lip between the slots and the channels and thereby forming enclosed coolant channels in the substrate. The slot covers are elongated flat members which, when in place, have an upper surface which is in the same plane as the exterior surface of the receiver. Slot cover 80 in FIG. 9 is shown against its associated slot.

The fluid must flow in sufficient volume through the channels to carry away the required amount of heat generated by the solar cells, and there must in addition be sufficient heat coupling between the fluid and the substrate to allow transfer of thermal energy to the fluid when there is only a small temperature difference between the substrate and the fluid. For the configuration shown, with the coolant channels in the individual fluid prefilter tubes, the flow rate through each prefilter tube need only be on the order of 0.018 gallons per minute.

With such a low flow rate, the cross-sectional area of the individual coolant channels must be relatively small so as to give a sufficiently high flow velocity to ensure a low enough heat transfer coefficient for adequate cooling of the solar cells. For a temperature drop on the order of 5° C. between the substrate and the fluid, a channel cross-sectional area will be approximately 0.01.

Figure 11:
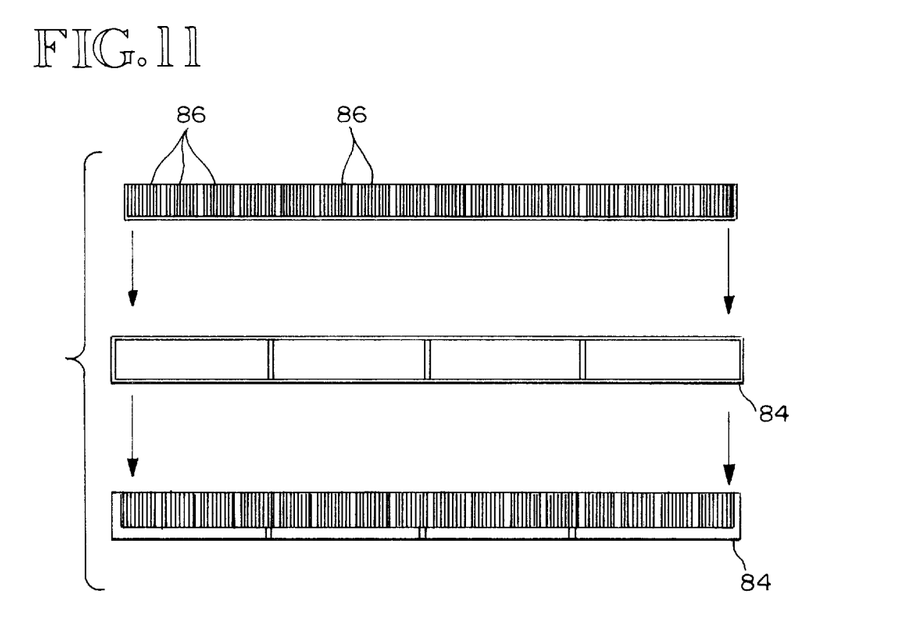
FIG. 11 is a view showing the structure for mounting the solar cells onto the surface of the receiver.

The individual solar cells, in a string arrangement, are attached to the exposed surface 81 of slot covers 80. In the embodiment shown, a total of 32 slot covers are present around the periphery of the receiver, with each slot cover 80 forming a base for one string of 16 solar cells. FIG. 11 illustrates one string (linear array) of 16 solar cells 86—86. The array in the embodiment shown is 3.15 inches long, using solar cells having a 0.5 centimeter×0.5 centimeter active area. The array includes an alumina substrate 84 on which the solar cells are mounted. Metallization on the alumina substrate 84 is patterned so that the back contacts of four adjacent cells are connected in parallel, thereby producing four groups of solar cells, with the cells in each group being in parallel to the other cells in that group. The alumina substrate in FIG. 11 is an electrical insulator, but has good thermal conductivity, with a coefficient of thermal expansion which is similar to the particular GaAs solar cells used in the embodiment shown. The matching coefficients of thermal expansion between the solar cells and the substrate is important in order to avoid possible fatigue failure of the bonds between the solar cells and the substrate, which might otherwise occur because of the continuous thermal cycling of the solar cell array due to successive periods of illumination and darkness.

The back contacts of four adjacent cells are connected in parallel in the array as shown. The top contacts of the cells are then connected in parallel as well by means of a soldered foil conductor (not shown). The foil conductor is configured to bridge over to the back contacts of the adjacent group of four cells. This occurs around the entire periphery of the receiver. Hence, successive groups of four cells connected in parallel are connected in series around the periphery of the receiver. This is how the separate 32 strings of 16 solar cells form basically four redundant 32-volt circuits. It should of course be understood that the individual solar cells could be configured electrically to produce different voltages and currents as desired.

Figure 12:
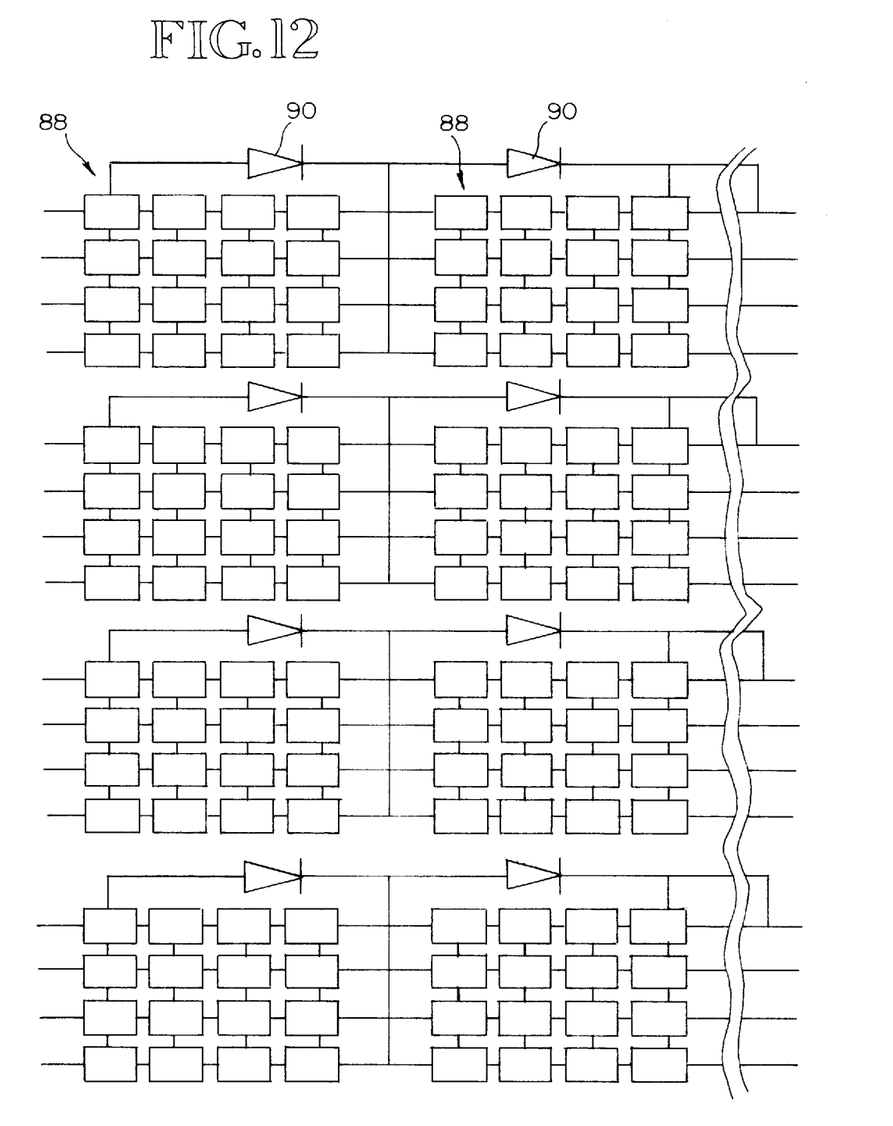
FIG. 12 is a view representing the connection of the solar cells on the receiver of the system of the present invention.

The solar cells are protected from any reverse bias by shunt diodes which are connected through openings in the substrate between the successive cell arrays. The diodes are mounted on the inside of the receiver substrate surface. Each matrix of 4×4 cells 88 has a shunt diode 90 associated with it, as shown in FIG. 12. The above-described connection arrangement thus provides for a total of four 32-volt arrays, with each array comprising successive matrices of 16 solar cells. This arrangement results in the overall system being much less vulnerable to one or more of the individual solar cells failing.

Hence, a solar concentrator system has been described which includes a primary reflector having an offset parabolic configuration, which results in solar rays incident on the surface thereof having a ring focus about the center axis of the reflector. This ring focus permits the use of a receiver having a particular configuration in which a plurality of strings of solar cells are arranged around its periphery. Each string of solar cells has a tubular prefilter positioned in front of it which acts as a secondary concentrator for its associated solar cell string.

This arrangement is highly efficient and produces high levels of concentration, i.e. 1500:1, without the necessity of an optical-quality surface primary reflector.

While a preferred embodiment of the invention is disclosed herein for illustration, it should be understood that various changes and modifications or substitutions may be incorporated in such embodiment without departing from the spirit of the invention, as defined by the claims which follow:

What is claimed is:

1. A solar concentrator system for focussing solar rays incident thereon to a receiver portion, comprising:

an off-set parabolic-shaped reflector having a reflective surface which is substantially flat from a center axis of the reflector to a circular line about the center axis which is located a selected distance from the center axis and from there is parabolic to a rim of the reflector, such that the focus of the reflector is on a ring surrounding the center axis, wherein the ring is in the vicinity of the plane of the rim of the reflector; and a receiver having a plurality of solar cells arranged on a peripheral surface thereof, the surface being generally coincident with the ring focus of the reflector.

2. An apparatus of claim 1, wherein said selected distance is within the range of 2 to 6 inches.

3. An apparatus of claim 1, wherein said selected distance is approximately 3 inches.

4. An apparatus of claim 1, wherein the system includes a prefilter assembly positioned around the periphery of the receiver and relatively close to the peripheral surface thereof, the prefilter assembly including individual portions which provide a secondary focusing of reflected solar rays onto specific areas on the peripheral surface of the receiver.

5. An apparatus of claim 4, including a plurality of solar cells positioned in each specific area of the receiver.

6. An apparatus of claim 5, wherein the solar cells are arranged on the peripheral surface of the receiver such that there is sufficient space on the peripheral surface for interconnection of the solar cells.

7. An apparatus of claim 4, wherein the prefilter portions are tubular members having a passageway to permit the movement of cooling fluid therethrough.

8. An apparatus of claim 1, wherein the solar cells are positioned in lines thereof on the peripheral surface of the receiver, wherein successive sets of solar cells in one line thereof are connected in parallel, and each set of cells is then connected in series with successive corresponding sets of solar cells in successive lines of solar cells around the periphery of the receiver.

9. An apparatus of claim 8, including at least 32 lines of solar cells, with each line comprising at least 4 sets of solar cells, and each set comprising at least 4 solar cells.

10. An apparatus of claim 1, wherein the receiver includes an inverted cone member, with the solar cells being mounted to the peripheral surface of said cone member.

11. An apparatus of claim 10, wherein the inverted cone member is hollow, having an annular portion which includes a peripheral surface on which the solar cells are mounted, the annular portion including a plurality of channels extending between the upper and lower ends thereof and a fluid plenum at each end thereof, thereby defining a continuous passageway for movement of cooling fluid throughout the receiver, wherein lines of solar cells are mounted on the peripheral surface adjacent each channel, so that movement of fluid through the channels draws away heat produced by the solar cells during operation thereof.

12. An apparatus of claim 1, wherein the ring has a height which is dependent upon the configuration of the reflector from the circular line to the rim.

* * * * *